United States Patent [19]

Hodge et al.

[11] Patent Number: 5,761,017
[45] Date of Patent: Jun. 2, 1998

[54] HIGH TEMPERATURE SUPERCONDUCTOR ELEMENT FOR A FAULT CURRENT LIMITER

[75] Inventors: James D. Hodge; Lori J. Klemptner, both of Lincolnwood; David S. Applegate, Wheeling, all of Ill.

[73] Assignee: Illinois Superconductor Corporation, Mount Prospect, Ill.

[21] Appl. No.: 490,943

[22] Filed: Jun. 15, 1995

[51] Int. Cl.$^6$ ................................................ H02H 9/00
[52] U.S. Cl. .................................. 361/19; 361/10
[58] Field of Search ........................ 361/2–13, 19, 361/57, 58; 174/125.1; 505/809

[56] References Cited

U.S. PATENT DOCUMENTS

| | | | |
|---|---|---|---|
| 4,189,693 | 2/1980 | Satti | 174/128 S |
| 4,486,800 | 12/1984 | Franksen | 361/19 |
| 4,763,404 | 8/1988 | Coffey et al. | 29/599 |
| 4,845,308 | 7/1989 | Womack, Jr. et al. | 174/15.4 |
| 4,924,198 | 5/1990 | Laskaris | 174/154 |
| 4,942,142 | 7/1990 | Itozaki et al. | 505/1 |
| 4,961,066 | 10/1990 | Bergsjöet al. | 338/32 S |
| 4,994,932 | 2/1991 | Okamoto et al. | 505/850 |
| 5,010,053 | 4/1991 | Maroni | 505/1 |
| 5,376,755 | 12/1994 | Negm et al. | 174/125.1 |
| 5,432,666 | 7/1995 | Hodge | 361/19 |

OTHER PUBLICATIONS

"A Superconducting Fault–Current Limiter." K.E. Gray et al., *J. Appl. Phys.*, vol. 49, No. 4, Apr. 1978.

"A Current Limiting Device Using Superconducting D.C. Bias Applications and Prospects," B.P. Raju et al., *IEEE Transactions on Power Apparatus and Systems*, vol. PAS–101, No. 9, Sep. 1982.

"Superconducting Fault Current Limiter and Inductor Design," J.D. Rogers et al., *IEEE Transactions on Magnetics*, vol. MAG–19, No. 3, May 1982.

(List continued on next page.)

*Primary Examiner*—Ronald W. Leja
*Attorney, Agent, or Firm*—Foley & Lardner; Michael D. Rechtin

[57] ABSTRACT

A high temperature superconductor fault current limiter and a method of using same. The fault current limiter comprises a high temperature superconductor material structure at least partially encapsulated in an epoxy having thermal conductivity properties that enable the superconductor to heat rapidly during a fault condition while preventing thermal runaway. The epoxy encapsulation decreases the critical current density of the superconductor material structure and increases the rate at which resistance increases with increasing current once the critical current density is exceeded. Preferably, the epoxy has thermal expansion properties approximately equal to the thermal expansion properties of the superconductor material structure.

20 Claims, 10 Drawing Sheets

OTHER PUBLICATIONS

"Fault Current Limiter Using a Superconducting Coil," H.J. Boenig et al., *IEEE Transactions Magnetics*, vol. MAG–19, No. 3, May 1983.

"Performance of a Vacuum Arc Commutating Switch For a Fault–Current Limiter," P.D. Pedrow et al., *IEEE Transactions on Power Apparatus and Systems*, vol. PAS–102, No. 5, May 1983.

Current Limiting Device—A Utility's Need, C.A. Falcone et al., IEEE Power Engineering Society Paper T 73 470–2, presented by title for written discussion at the IEEE PES Winter Meeting, New York, New York, Jan. 27–Feb. 1, 1974.

"Fault Current Limiters—An Overview of EPRI Research," V.H. Tahiliani et al., *IEEE Transactions On Power Apparatus and Systems*, vol. PAS–99, No. 5, Sep./Oct. 1980.

"NbN Materials Developement For Practical Superconducting Devices," R.T. Kampwirth et al., *IEEE Transactions on Magnetics*, vol. MAG–17, No. 1, Jan. 1981.

"High–Temperature Superconductors For Space Power Transmission Lines," J.R. Hull et al., presented at The Winter Annual Meeting of The American Society of Mechanical Engineers, Dec. 10–15, 1989.

"Reliability Implications in the Design of Fault Current Limiters," P. Barkan, *IEEE Transactions on Power Apparatus and Systems*, vol. PAS–99, No. 5, Sep./Oct. 1980.

"Advantages of High–Temperature Superconductivity in Large–Scale Applications," ASME Winter Annual Meeting, Published in MD—vol. 11, pp. 1–7, Nov.–Dec. 1988.

"Low Operating Voltage Superconducting Current Limiter," M.A. Hilal et al., presented at the proceedings of the 1991 Cryogenic Engineering Conference, Huntsville, Alabama, Jun. 11–14, 1991.

─□─ 5 SEC   ─◇─ 2.5 SEC   ─△─ 7.5 SEC

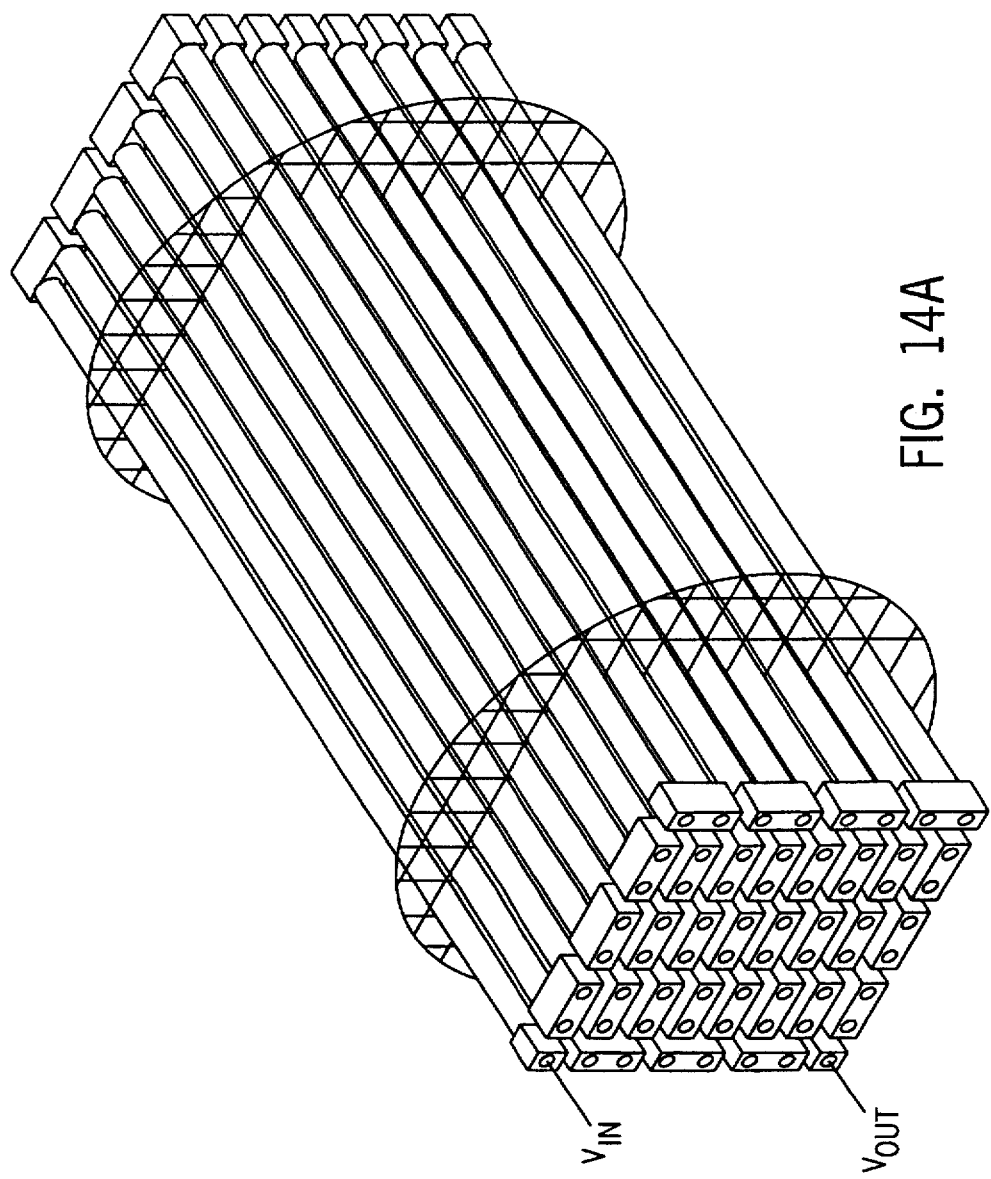
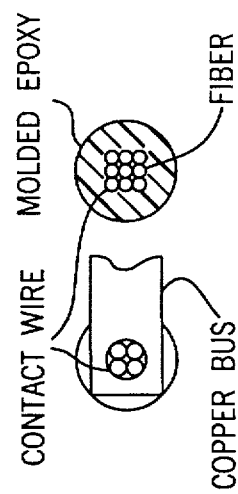
FIG. 14A
FIG. 14C ated by the fault current limiter is much less than the cost
HIGH TEMPERATURE SUPERCONDUCTOR ELEMENT FOR A FAULT CURRENT LIMITER

BACKGROUND OF THE INVENTION

The present invention is directed to a high temperature superconductor fault current limiter. More particularly, the invention is directed to a high temperature superconductor fault current limiter element at least partially encapsulated in epoxy, or another suitable thermal control component. The encapsulated element exhibits reduced critical current density and increases the rate at which resistance increases in the element with increasing current, once the critical current density is exceeded.

Fault currents are temporary, large increases in the normal current in a power transmission line or system. These fault currents can arise from unusual natural events, such as lighting strikes, or can arise from catastrophic failure of electrical equipment. The fault currents can introduce large, unwanted currents in electrical systems which can cause severe damage and accompanying large financial losses. Due to the increasing interconnection of power systems, the effect of electrical power equipment failures can also be devastating on a larger scale.

Currently, there is a large and increasing demand for reliable fault current limiters, such as in tandem high voltage transmission systems. For example, in 1980 circuit breaker replacement costs were about $13 million in the United States alone. Using conventional circuit breaker type technology or other such known devices, each piece of equipment must be able to withstand a maximum fault current. If a well designed fault current limiter is available, this requirement is unnecessary, and lower cost equipment can be used in the remainder of such a system.

There are two major types of known fault current limiters: (1) switched devices; and (2) unswitched devices. Examples of the unswitched type include (a) saturable and tuned reactors (a device that introduces either inductive or capacitive reactance into a circuit, e.g., a coil) whose impedance increases when current exceeds a specified threshold, (b) a superconductor material which changes to a normal resistance state when the current exceeds a prescribed limit, and (c) in-line fuse devices which change phase and generate high arc voltages. Unswitched devices typically have been expensive to purchase and maintain, and have often suffered from performance capability problems.

Most fault current limiters currently in use are switched devices wherein current is commuted from a low-impedance main path to a higher-impedance shunt path by various switching means. These switched devices must commute the current in a small time interval (typically less than half a period of a 60-hertz cycle, i.e., less than about eight milliseconds), and such requirements lead to complex equipment construction with high performance standards.

In another conventional switched device, a tuned circuit has no impedance in the normal state and is switched to a resistive and inductive impedance which can be made as large as necessary to accomplish the desired switching. The cost of such devices is about $4.00 per kV-ampere in 1980 dollars. The power losses are excessive (almost 0.1%), and such devices also require extremely large capacitors.

Other fault current limiter systems include series reactors which have the disadvantage of diverting power under normal system operation. This operating state reduces transient stability margins if installed in power stations with generating units. These systems also require substantial space, and transient recovery voltages can exceed circuit breaker capacities.

Another conventional system includes high-speed ground switches. Such switches have the disadvantage of occasionally causing more severe faults and causing longer fault durations.

Systems of prior art superconductor fault current limiters include a superconductor solenoid in a bridge circuit of diodes or thyristors. During typical operation the full line current passes through the solenoid; and the current is passed in such a way that the solenoid sees only a DC current with a small ripple resulting in nearly zero impedance. When the current increases to the fault level, one pair of the diodes is reverse-biased and no longer performs as a conductor. Therefore, the entire current must pass through the inductor, and a very high impedance is exhibited. The only losses in the circuit are those of the AC current passing through the diodes which is about 0.07–0.14%.

Another variety of conventional fault current limiter uses a superconductor coil to DC-bias an iron-core reactor. The device consists of two iron-core reactors in series per phase, and these cores are linked by a common electromagnetically screened DC superconductor loop. Each reactor coil is wound on the center limb of a three-limbed core, and the line current passes through the reactor coils. The superconductor coil is linked only via transformer action. Under typical operation when rated MVA is passing through, the DC ampere turns are of such a value that both cores are saturated with the result that they offer the low saturated impedance of both coils in series. When a fault occurs, the cores desaturate alternatively during a cycle; and the impedance rises to a higher value. This higher-value impedance is the saturated reactance of one coil added to the driving-point impedance of the other due to transformer action with the DC screen, thereby limiting the current. In an experimental device of about 1.7 MVA, the normal state losses were about 1.6 kW. In the normal state, the slight difference in the magnetic state of the two cores causes some distortion of the voltage across the device.

In another conventional unit, a low-temperature superconductor strip is used. When a fault is detected in such a device, the strip is made resistive by transition into the normal state. Most of the current is shunted into a parallel resistor, and then a breaker or switch opens in the superconductor circuit. The reduced current in the superconductor circuit enables a low-current switch to be used. Unfortunately, the length of superconductor material needed for such a practical device is typically about 600 meters, which likely means it would be too expensive for commercial use. Also, hot spots can occur due to inhomogeneous switching and subsequent burnout.

It is therefore an object of the invention to provide an improved fault current limiter.

It is another object of the invention to provide a novel fault current limiter using a high temperature superconductor device exhibiting controlled thermal heat capacity.

It is a further object of the invention to provide an improved high temperature superconductor fault current limiter including a superconductor element encapsulated in epoxy or other suitable thermal control component or material.

It is an additional object of the invention to provide a novel fault current limiter using a high temperature superconductor filament encapsulated in an epoxy having a thermal expansion coefficient approximately equal to or greater than that of the filament.

It is another object of the invention to provide an improved high temperature superconductor fault current limiter causing no substantial distortion in electrical transmission during typical operation.

It is a further object of the invention to provide a novel fault current limiter using a high temperature superconductor filament encapsulated in epoxy and compressed by the epoxy during typical operation.

It is an additional object of the invention to provide an improved fault current limiter and a method of using the fault current limiter including a superconducting element encapsulated in a material that enables element resistance to increase sharply during a fault condition while preventing thermal runaway.

The features of the present invention which are believed to be novel are set forth with particularity in the appended claims. The invention, together with the further objects and advantages thereof, may best be understood by reference to the following description taken in conjunction with the accompanying drawings, wherein like reference numerals identify like elements.

BRIEF DESCRIPTION OF THE DRAWINGS

FIGS. 14A, 14B and 14C show isometric, end and section views, respectively, of a fault current limiting device using epoxy encapsulated conductors.

DESCRIPTION OF PREFERRED EMBODIMENTS

Resistive fault current limiters based on high temperature superconductors should be designed to safely dissipate the heat generated within the superconductor during a fault. High temperature superconductor materials have low thermal conductivity, and boiling liquid nitrogen has extremely low specific heat. These factors make cooling of fault current limiter devices based on bulk superconductor components (cooled with boiling liquid nitrogen) very susceptible to thermal runaway and burn-out during a fault. To a certain degree, a temperature rise in the superconductor during a fault is beneficial in that it increases the ultimate resistance achieved during a fault. However, damage and even ultimate failure of the device can occur unless this temperature rise is carefully controlled.

While cooling a high temperature superconductor fault current limiter by immersion in boiling liquid nitrogen is the simplest and most economical refrigeration scheme, boiling liquid nitrogen is not an effective coolant when large amounts of heat must be dissipated quickly. This is a result of the low heat of vaporization of liquid nitrogen causing the boiling mechanism at a heated surface to quickly shift from a 'nucleate boiling' regime, where heat can be efficiently dissipated, to a 'film boiling' regime, where the formation of a continuous layer of nitrogen vapor at the heated surface reduces heat transfer away from the surface by orders of magnitude over the heat transfer rate for nucleate boiling. Consequently, a high temperature superconductor filament in liquid nitrogen subjected to a current pulse substantially over its critical current density behaves almost adiabatically once the film boiling regime is entered (see FIG. 1). This fact has been confirmed by both direct experimental observation and computer modeling of the heat transfer in this system.

Figure 1:
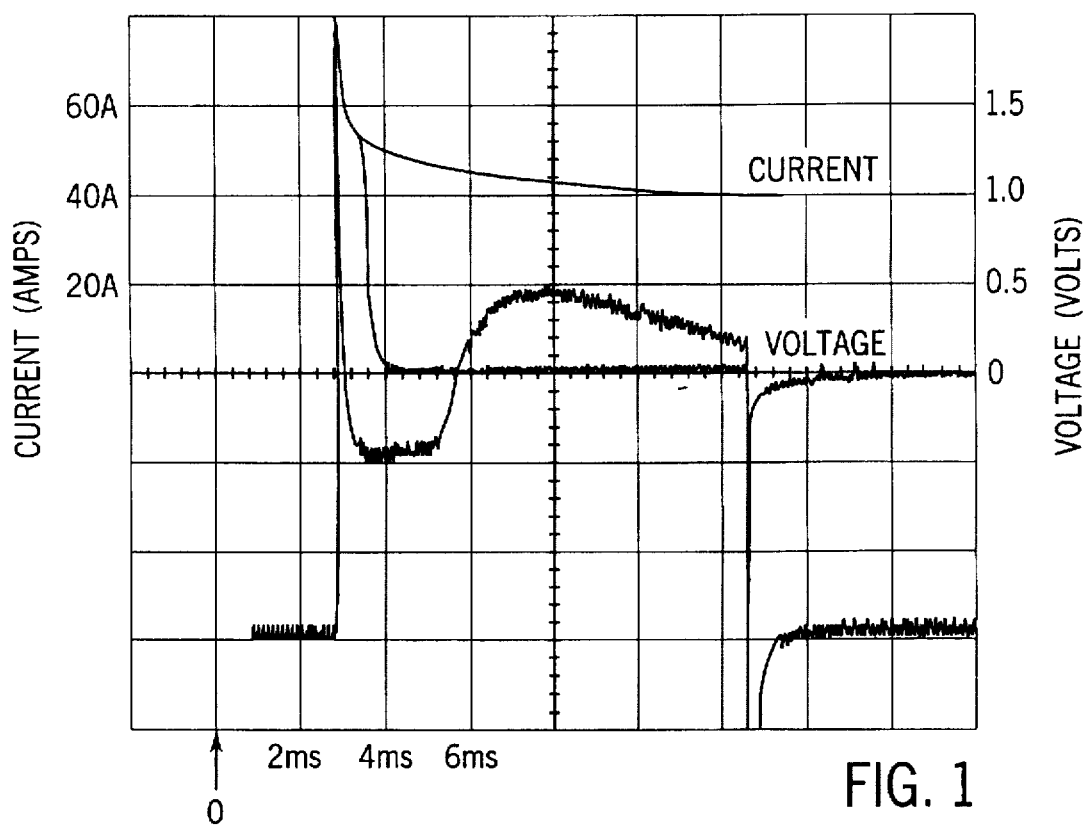
FIG. 1 illustrates the onset of thermal runaway in a YBCO filament as measured by voltage and current in the filament.

While a variety of superconducting materials having different shapes can be used satisfactorily in preferred embodiments of the invention, $YBa_2Cu_3O_{7-x}$ ("YBCO") or 123YBCO filaments are described herein for nonlimiting, illustrative purposes. YBCO filaments having diameters of 0.035" and critical currents of 6.5 amperes were sintered at reduced oxygen pressure in the 800° C.–900° C. temperature range for times between one and three hours. Other process conditions such as different temperatures and atmospheres can be used satisfactorily without departing from the invention. It was observed experimentally that a sintered YBCO filament failed due to thermal runaway when a current of fourteen to sixteen amperes was applied for five seconds. Other experiments monitored the voltage across a similar YBCO filament using an oscilloscope while a sixty ampere current pulse was applied to the filament for ten milliseconds. After a one- to two-millisecond incubation period, a dramatic rise in the conductor voltage was observed, indicating the onset of thermal runaway. This behavior is illustrated in FIG. 1. In parallel with these experimental observations, computer modeling using a conventional heat transfer computer program (ICARUS) verified that the temperature rise associated with even short (less than ten milliseconds) current pulses can damage the above-described superconductor filament.

Figure 2A:
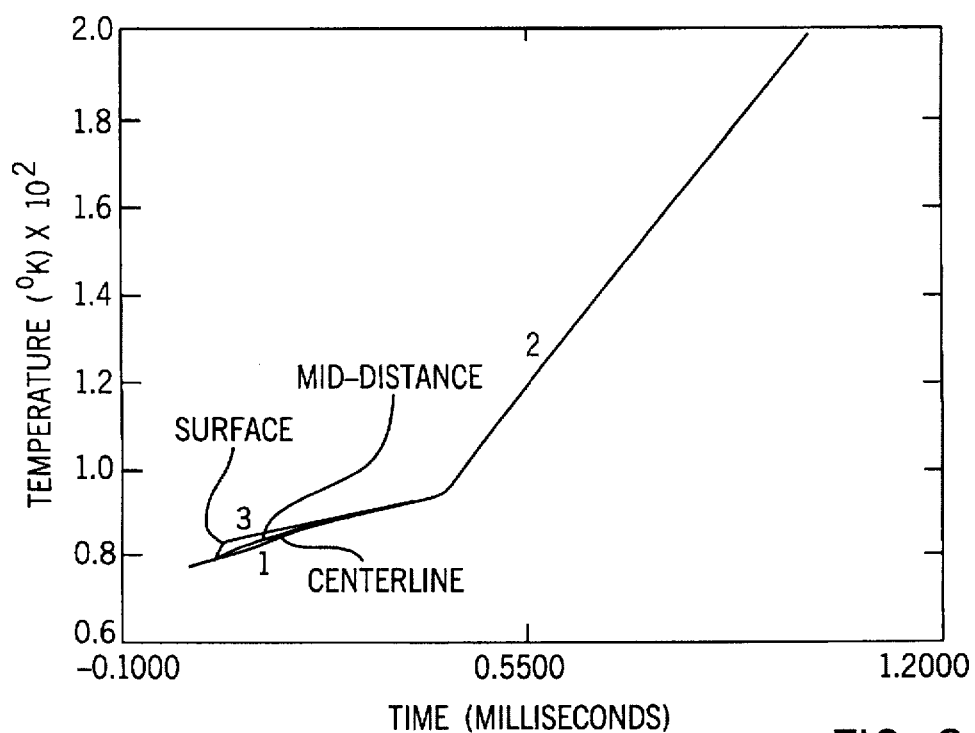
FIG. 2A shows calculated temperature rise at the centerline, mid-distance and surface of a one-millimeter-diameter filament having a critical current of six amperes subjected to a ten-millisecond-long, twenty-ampere pulse while immersed in boiling liquid nitrogen
Figure 2B:
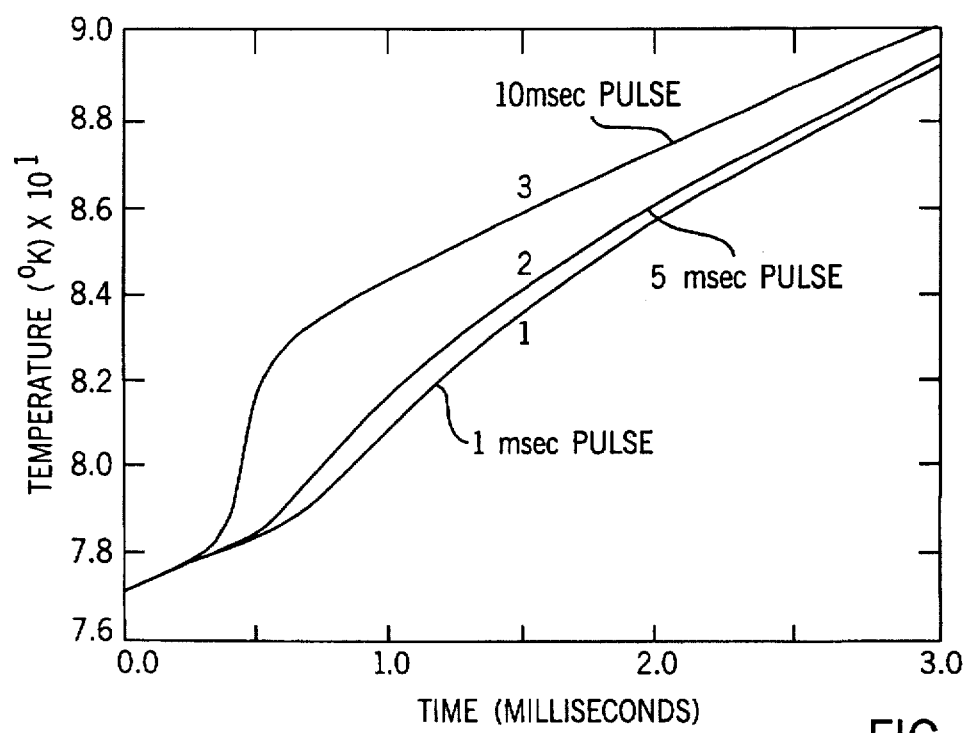
FIG. 2B shows an expanded view of the initial parts of the curves shown in FIG. 2A.

FIG. 2 shows the calculated temperature rise in a one-millimeter-diameter filament having a critical current of six amperes ($j_c$=1100 A/cm$^2$) subjected to a ten-millisecondlong, twenty-ampere pulse while it is immersed in boiling liquid nitrogen. The centerline, mid-distance and surface temperatures in the filament are shown in FIGS. 2A and 2B. As the temperature rise becomes essentially adiabatic, these three temperatures are essentially identical.

Figure 3:
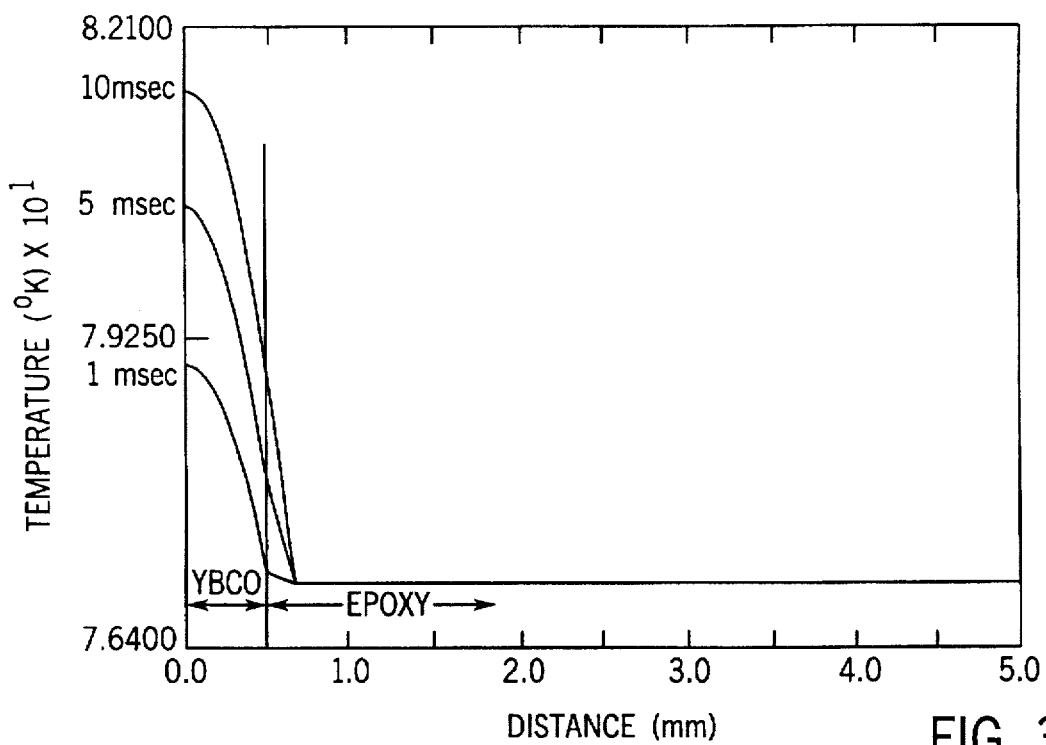
FIG. 3 illustrates centerline temperatures after current pulses of one, five and ten milliseconds for the filament in FIG. 2 encapsulated in a five-millimeter-thick layer of epoxy and subjected to a twenty-ampere, ten-millisecond current pulse.

In one preferred embodiment of the invention, a high temperature superconductor filament was encapsulated in epoxy. The epoxy encapsulation substantially increased the filament's ability to dissipate heat during a current pulse. For example, a one-millimeter-diameter YBCO filament ($j_c$= 1100 A/cm$^2$) embedded in a five-millimeter-thick layer of epoxy and subjected to a twenty-ampere, ten-millisecond current pulse reduced the maximum centerline temperature in the filament to 82 K as is illustrated in FIG. 3. While epoxy is described herein for nonlimiting, illustrative purposes, other materials such as filled thermoplastics, i.e., polyethylene, polypropylene, polyvinyl butyral, or polystyrene with silica, alumina, or clay fillers could be used satisfactorily as a thermal control component. Thermal conductivities of these materials are similar to those of the epoxies. In the more general sense, the thermal resistance of a material can be controlled by using a particular material thickness or geometry and having a thermal conductivity which enables achieving a desired thermal balancing effect described hereinafter.

In a preferred embodiment of the invention computer modeling using ICARUS demonstrates even more advantageous results are obtained for the epoxy-embedded superconductor filament if both the filament diameter and the thickness of the epoxy layer are reduced. This is demonstrated in FIG. 4 where a similar calculation is performed for a 0.12-millimeter-diameter filament with a one-millimeter layer of epoxy. This figure shows the thermal profile through the filament/epoxy composite for 0.8 A current pulses for periods of one, five and ten milliseconds (this current pulse is the equivalent current density of a 50 A pulse in a one-millimeter-diameter filament). Note that the use of a smaller diameter significantly reduces the centerline temperature rise during a more substantial fault.

Figure 4:
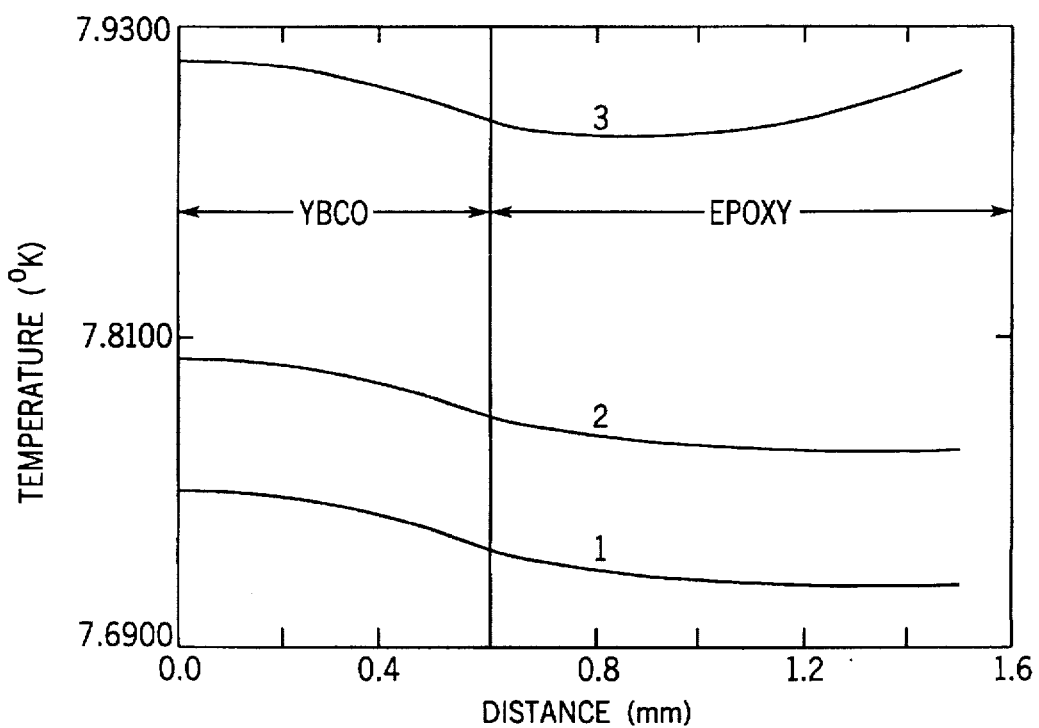
FIG. 4 shows centerline temperatures after current pulses of one, five and ten milliseconds applied to a 0.12 millimeter diameter filament encapsulated in a one-millimeter layer of epoxy.

The results shown in FIGS. 3 and 4 are based on estimated thermal conductivities of an epoxy that has been filled with an inorganic solid to optimize its thermal conductivity. Average values of filled commercial epoxy thermal conductivity and specific heat were used for this calculation.

Figure 5:
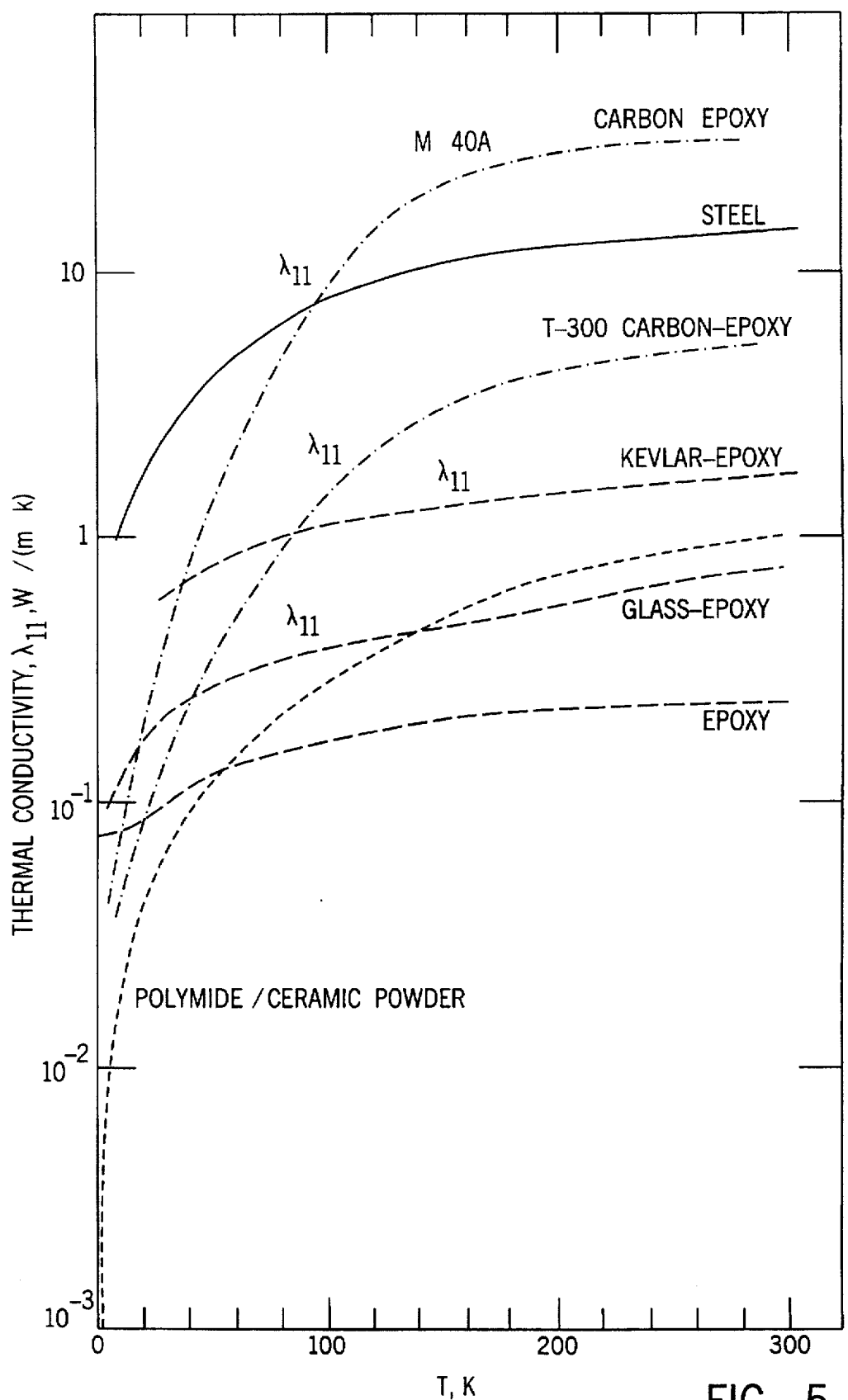
FIG. 5 illustrates thermal conductivities of various commercial epoxy systems and shows thermal conductivity as a function of temperature below room temperature.

Another useful selection criterion for the epoxy (or other material) used to coat the YBCO filament is concerned with having a good thermal expansion match with the YBCO. Epoxies having thermal expansion coefficients ($\alpha_{volume}$) of approximately 40–60×10$^{-6}$/°C. provided favorable results. These results are believed to be attributable to the epoxy thermal expansion characteristics being no larger than 50% greater than that of YBCO ($\alpha_{volume}$=42×10$^{-6}$/°C. between 77K and room temperature). Epoxies having volume thermal expansion coefficients of 61–87×10$^{-6}$/°C. (approximately 50–100% greater than that of YBCO) yielded less favorable results. As a consequence, the epoxy systems that are satisfactory for this application can have very different thermal conductivities than that used to estimate the thermal properties of these epoxy/superconductor composites. FIG. 5 gives some indication of the range of the thermal conductivities of various commercial epoxy systems.

A number of commercially available epoxy systems, both filled and neat, were examined experimentally. As mentioned above, it is important in selecting an epoxy system to match, reasonably closely, the thermal expansion of the YBCO filament to ensure thermomechanical integrity of the fault current limiter. However, in accordance with preferred embodiments of the invention, the thermal conductivity of the epoxy system must also be suitable for achieving a quasi-stable, or balanced, thermal state as described subsequently. The Table presents a list of the commercial epoxies that were evaluated along with their measured thermal expansion coefficients. Note that the volume thermal expansion coefficient for YBCO (measured between room temperature and 77K) is 42×10$^{-6}$/°C. As the measured values of the epoxies shown in the Table indicate, this is substantially lower than most commercial epoxies. However, a number of low thermal expansion systems are available which approach this value; specifically, those made by Thermoset, ResTech, and Mavidon.

TABLE

Epoxy Systems Evaluated for Use as Potting Compounds

| Manufacturer - Product | Mft. Location | vol % Filler Added | vol. CTE (°C.$^{-1}$) | Thermal Conductivity (W/m - K) |
|---|---|---|---|---|
| Emerson & Cuming - E & C W67 | Woburn, MA | none | 185 × 10$^{-6}$ | not available |
| Emerson & Cuming - E & C W19 | | none | 150 × 10$^{-6}$ | not available |
| Emerson & Cuming - E & C W19 | | 32% CaCO$_3$ | 104 × 10$^{-6}$ | not available |
| Emerson & Cuming - E & C W19 | | 37% CaCO$_3$ | 85 × 10$^{-6}$ | not available |
| Emerson & Cuming - E & C W19 | | 45% CaCO$_3$ | 75 × 10$^{-6}$ | not available |
| Emerson & Cuming - Stycast 2850KT | | none | 40 × 10$^{-6}$ | 2.8 @ 25° C. |
| Eager Plastics - EP 7903 | Chicago, IL | none | 197 × 10$^{-6}$ | not available |
| SPi - Spurr | West Chester, PA | none | 217 × 10$^{-6}$ | not available |
| SPi - Spurr | | 40% CaCO$_3$ | 102 × 10$^{-6}$ | not available |
| SPi - Spurr | | 45% CaCO$_3$ | 89 × 10$^{-6}$ | not available |
| SPi - Ultra | | none | 268 × 10$^{-6}$ | not available |
| SPi - Ultra | | 14% alumina | 200 × 10$^{-6}$ | not available |
| SPi - Ultra | | 25% alumina | 164 × 10$^{-6}$ | not available |
| SPi - Ultra | | 27% cordierite | 146 × 10$^{-6}$ | not available |
| SPi - Ultra | | 30% cordierite | 145 × 10$^{-6}$ | not available |
| SPi - Ultra | | 33% CaCO$_3$ | 150 × 10$^{-6}$ | not available |
| SPi - Ultra | | 43% CaCO$_3$ | 134 × 10$^{-6}$ | not available |
| Epo-Tek - 509K | Billerica, MA | none | 149 × 10$^{-6}$ | not available |
| International Coatings - ICO Grout | Rosemont, IL | none | 192 × 10$^{-6}$ | not available |
| International Coatings - Quartz 120 SB | | none | 190 × 10$^{-6}$ | not available |
| International Coatings - Quartz 120 DB | | none | 137 × 10$^{-6}$ | not available |

TABLE-continued

Epoxy Systems Evaluated for Use as Potting Compounds

| Manufacturer - Product | Mft. Location | vol % Filler Added | vol. CTE (°C.$^{-1}$) | Thermal Conductivity (W/m - K) |
|---|---|---|---|---|
| Abatron - Abocast 22-30/50-3 | Gilberts, IL | none | $122 \times 10^{-6}$ | not available |
| ResTech - 148/027 | Commerce City, CO | none | $93 \times 10^{-6}$ | 0.9 @ 70° C. |
| ResTech-013/162 | Commerce City, CO | none | $87 \times 10^{-6}$ | 0.3 @ 25° C. |
| Mavidon - 4195 | Palm City, FL | none | $82 \times 10^{-6}$ | not available |
| Thermoset - 340/18 | Indianapolis, IN | none | $50 \times 10^{-6}$ | 1.6 @ 25° C. |
| Shell - 9400/9450 | Houston, TX | none | $118 \times 10^{-6}$ | not available |
| ETI - Envirotex Lite | Fields Landing, CA | none | $167 \times 10^{-6}$ | not available |
| Composite Technology Devlpt. - 620 | Boulder, CO | none | $45 \times 10^{-6}$ | −0.2 @ 77 K. |
| Composite Technology - 620 'Putty' |  | none | $85 \times 10^{-6}$ | not available |
| Composite Technology - 620 'Putty' |  | 18% alumina | $63 \times 10^{-6}$ | not available |
| Composite Technology - 501 |  | none | $103 \times 10^{-6}$ | not available |
| Composite Technology - 501 |  | 26% alumina | $85 \times 10^{-6}$ | not available |
| Composite Technology - 101 |  | 22% alumina | $88 \times 10^{-6}$ | not available |
| Composite Technology - 101 |  | 33% alumina | $76 \times 10^{-6}$ | not available |
| Composite Technology - 101 |  | 40% alumina | $61 \times 10^{-6}$ | 5. @ 77° K. |
| Composite Technology - 101G |  | none | $61 \times 10^{-6}$ | 5. @ 77° K. |
| Composite Technology - 101H |  | none | $58 \times 10^{-6}$ | 0.5 @ 77° K. |
| Conap. - Conapoxy DPFR 12622 | Olean, NY | none | $40 \times 10^{-6}$ | 1.4 @ 25° C. |

Figure 6:
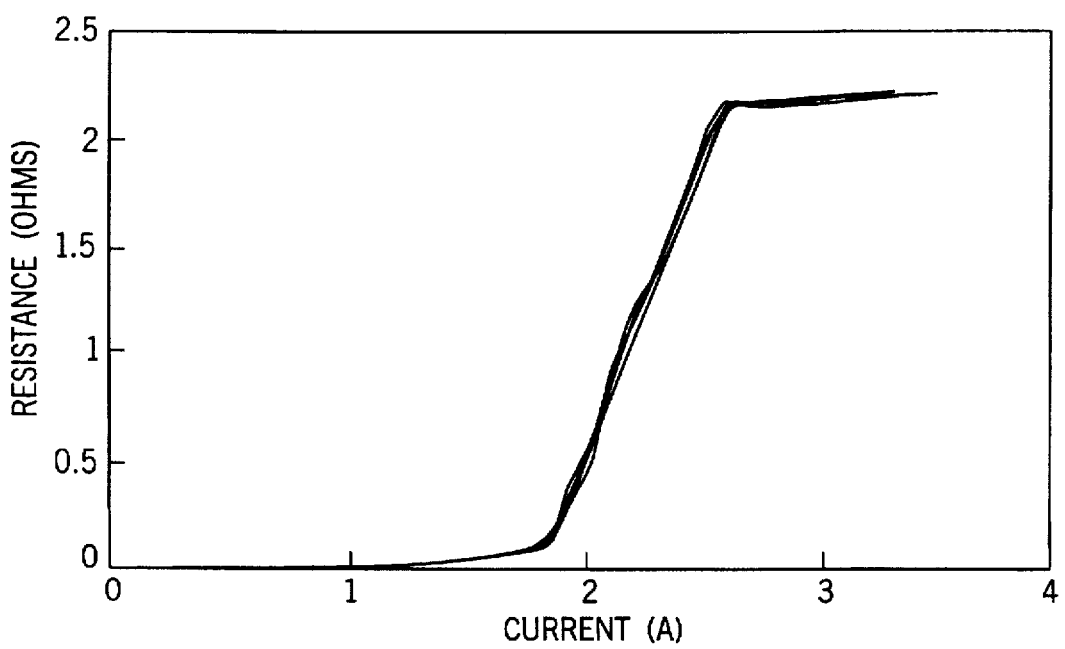
FIG. 6 shows five consecutive I-V tests on one particular sample, illustrating the thermomechanical stability of the epoxy/YBCO composite.

The ResTech 013/162 epoxy having a thermal conductivity of 0.3 W/m-k at 25° C. was used to encapsulate several standard-diameter (0.030") YBCO filaments. Encapsulation was performed by soldering lead wires on the filament, suspending the filament in a plastic tube, and filling the tube with the viscous uncured epoxy. For less viscous epoxies, the end of the tube was sealed with a cotton, paper/tissue or rubber septa plug. After filling, the ends of the tube were plugged with paper until the epoxy had been cured. I-V curves were then generated in the usual manner on these samples. The resistance versus current relationship of a representative filament is shown in FIG. 6. An alternate method of encapsulating superconductor filaments used a silicone mold shaped like a rectangular box without a top. The filament to be encapsulated was supported only at its tips in the center of the cavity, and uncured epoxy was poured in around the fiber until the cavity was full. This method yielded devices that performed similarly to filaments produced by the plastic tube molding method.

FIG. 6 illustrates the results of five consecutive I-V tests on the same sample. Between each test, the sample was cycled to room temperature. The reproducibility of these curves indicates that thermomechanical stresses were not causing the sample to degrade with time. In other words, the ResTech 013/162 epoxy/YBCO composite, in spite of the differing thermal expansions of these materials, appears to be thermomechanically stable. It should be noted that there are beneficial effects of the epoxy having a higher thermal expansion coefficient than the YBCO filament. During cooling, the epoxy will tend to shrink more than the YBCO. As a consequence, the filament is placed in compression. This imposed compressive stress increases the applied stress required to fracture the high temperature superconductor and, therefore, improves the mechanical strength of the filament.

The I-V curves represented in FIG. 6 are substantially different than those observed in previous examples. There are two distinct inflection points in the curves at 1.8 A and 2.4 A. In addition, the resistance developed in this sample is significantly higher than what has been observed in bare filaments (on the order of ohms as opposed to milliohms).

Figure 7:
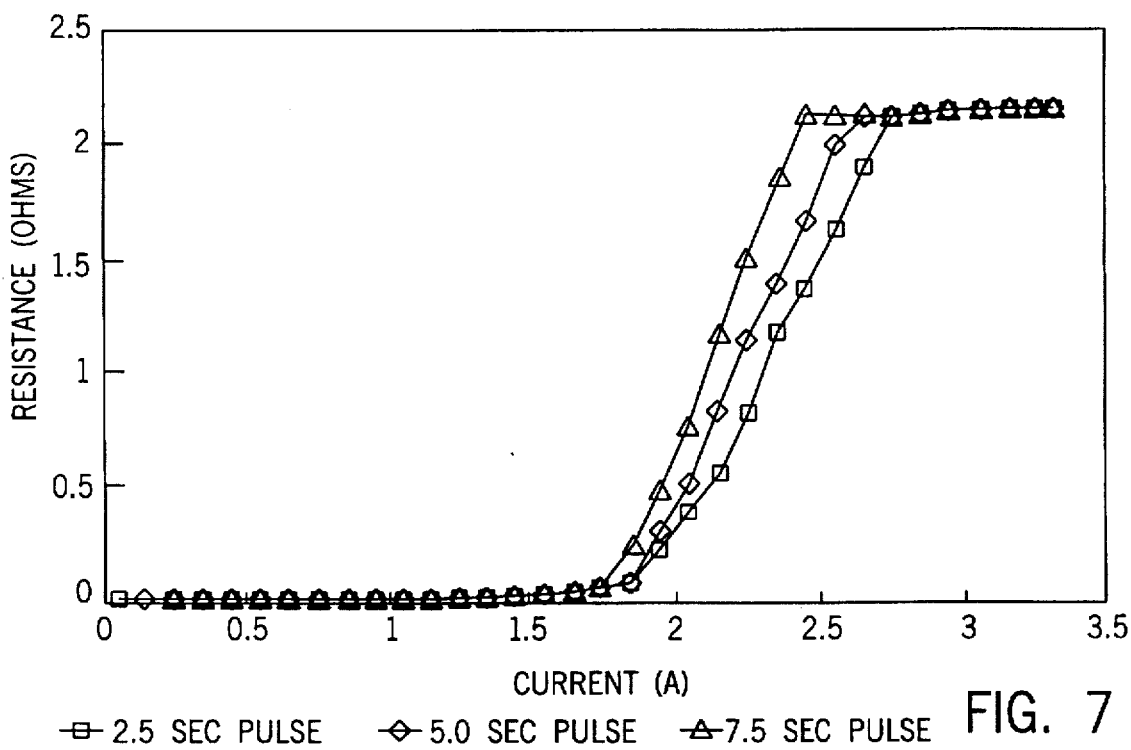
FIG. 7 illustrates increasing sample resistance with increasing pulse length at a given current level.

The explanation for the I-V curves observed for this epoxy-encapsulated filament is that these curves represent the filament's response to the temperature increase associated with Joule heating in the sample. It is not believed to represent the isothermal response of the high temperature superconductor to current in excess of its critical current density. The two inflection points observed in these curves are thus artifacts of this predominantly thermal response. The first inflection point represents the filament's transition from a dynamic resistance mode to one where the sample's normal-state resistance begins to develop, i.e., the filament temperature has exceeded 90K. The second inflection point represents the point at which the filament temperature has reached a steady state value in excess of the filament's superconductor material's critical temperature. This explanation is supported by the fact that the shape of the I-V curve changes with the length of the current pulse used to generate the curve, as is illustrated in FIG. 7. FIG. 7 also shows that filament resistance increases with increasing pulse length at a given current level.

This essentially thermal response shown in FIG. 7 predominates for the encapsulated filament due to the fact that the epoxy used in this example serves to insulate the filament from the liquid nitrogen. In accordance with this preferred embodiment of the invention, a means for insulating the filament (such as epoxy or other suitable material) enables a quasi-stable, or balanced, thermal state to be achieved. The quasi-stable thermal state is achieved by selecting the insulating means with thermal conductivity, or more generally thermal resistance, sufficient to insulate the filament from a cryogen while preventing thermal runaway. The insulating means enable filament heating and concurrent sharp resistance increase during a fault condition as the filament "goes normal", but does not allow uncontrolled filament heating. This quasi-stable thermal state exists in a filament temperature range defined at one end by the filament going "normal" and by the onset of thermal runaway at the other end of the temperature range. Proper selection of the thermal conductivity (or thermal resistance generally) of the insulating means, the cryogen and filament diameter enables proper fault current limiting operation in desired current range.

The presence of the epoxy adjacent to the superconductor serves a number of functions set forth hereinafter as nonlimiting, illustrative examples. First, and most important, it provides a thermal mass with a specific heat that is significantly above that of an equivalent volume of 77K liquid nitrogen. Second, the epoxy insulates the superconductor so that it heats up during a fault, thus maximizing the ultimate resistance that the conductor achieves. Third, the epoxy provides mechanical support that makes the device substantially more robust than a non-encapsulated conductor.

Note that for short (millisecond) pulses, the specific heat of the material plays a greater role in the thermal behavior of the device than thermal conductivity, as the times involved are too short to permit substantial transfer of heat out of the vicinity of the conductor. For longer pulses, thermal conductivity begins to play an increasingly important role. Note also that for successful use in this device, the choice of epoxy is critical; too low of a thermal conductivity will result in a device that is essentially adiabatic and will burn-out due to thermal run-away; too high of a thermal conductivity will result in a lower ultimate resistance in the device.

Figure 8:
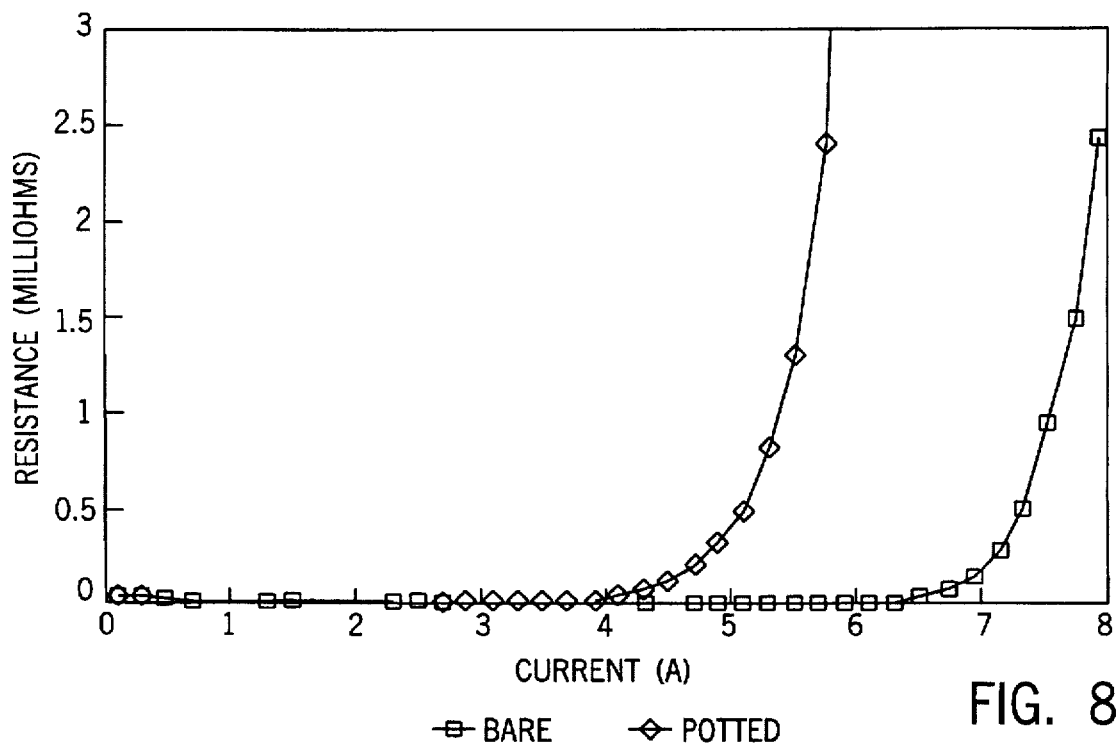
FIG. 8 illustrates the I-V behavior of a YBCO filament before and after epoxy encapsulation.
Figure 9:
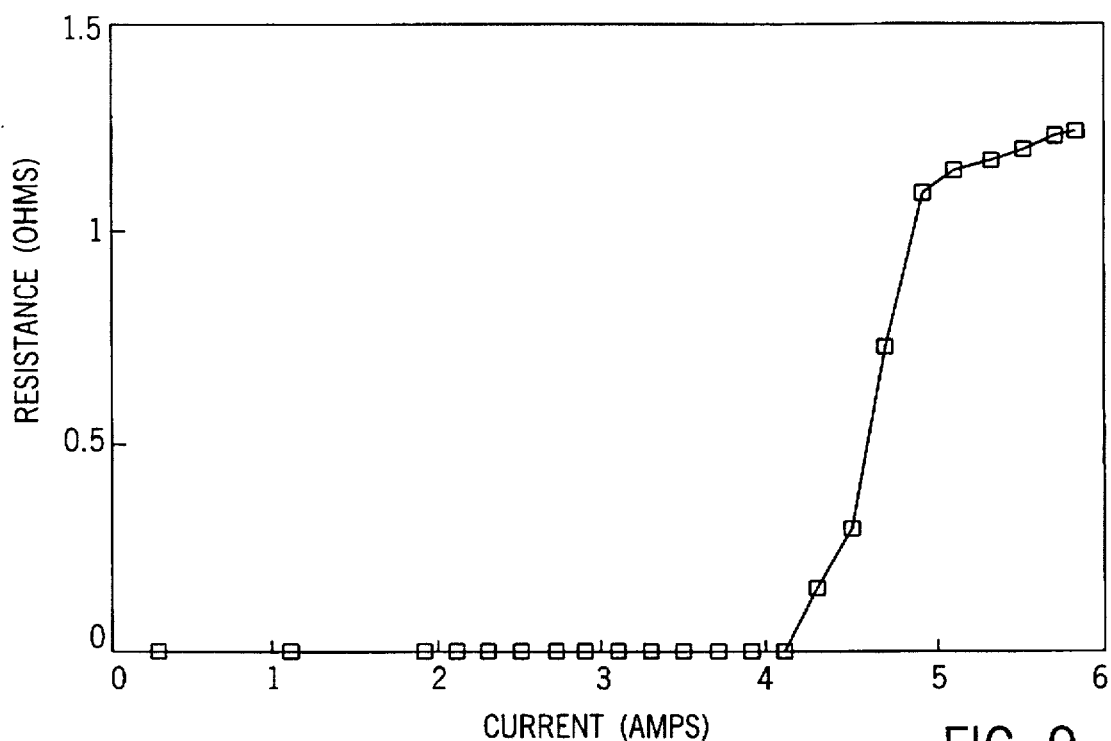
FIG. 9 shows the I-V behavior of another encapsulated filament.

FIG. 8 compares the I-V behavior of a YBCO filament before and after epoxy encapsulation. Two features are significant: first epoxy, encapsulation reduces the critical current density significantly and second, epoxy encapsulation greatly increases the rate at which resistance increases with increasing current once the critical current density is exceeded. The reduction of critical current density is somewhat disadvantageous to the operation of the current limiter in that it limits the unfaulted current carrying capacity of the superconductor. This disadvantage is more than offset, however, by the greatly increased sensitivity of the material's resistance to current level above the critical current density threshold. The magnitude of this sensitivity is shown in FIG. 9, where the I-V behavior of an encapsulated filament is shown. As indicated, the terminal resistance on this nineteen-centimeter-long filament approaches 1.3 $\Omega$ which is substantially greater than the terminal resistance of a similar bare filament of 0.05–0.10 $\Omega$.

The epoxy encapsulation is effective in increasing the terminal resistance of the YBCO filament because it reduces the flow of heat from the filament. The filament, consequently, heats up more rapidly once its critical current is exceeded and resistance develops in the filament. This same effect could be achieved by operating a bare filament in cold (77K) nitrogen or helium vapor. However, the heat transfer from such a vapor-cooled filament can be so low that the filament will go into "thermal runaway" at relatively modest current levels and fuse. The epoxy encapsulation technique is much more effective at achieving the quasi-stable thermal state in that it reduces the heat transfer from the filament, but only to such a level that the temperature rise in the fault condition is controlled to below where the filament would be damaged.

Figure 10:
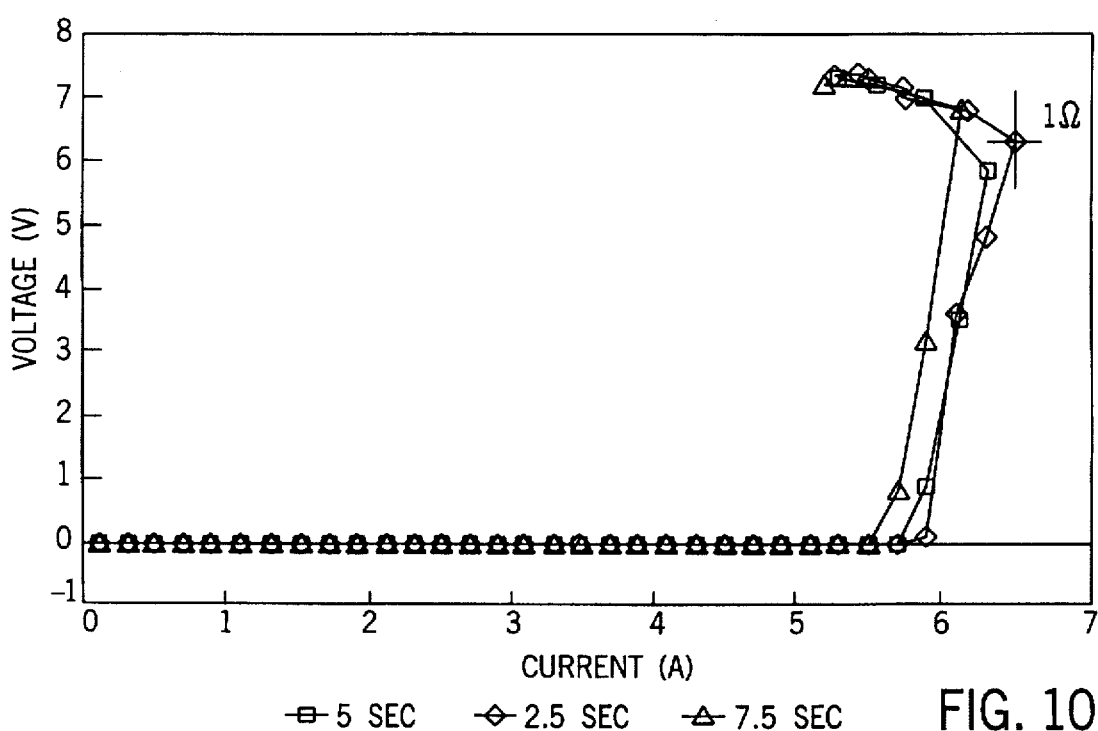
FIG. 10 illustrates a series of I-V curves for an epoxy-encapsulated filament for current pulse lengths of 2.5 seconds, 5 seconds and 7.5 seconds.
Figure 11:
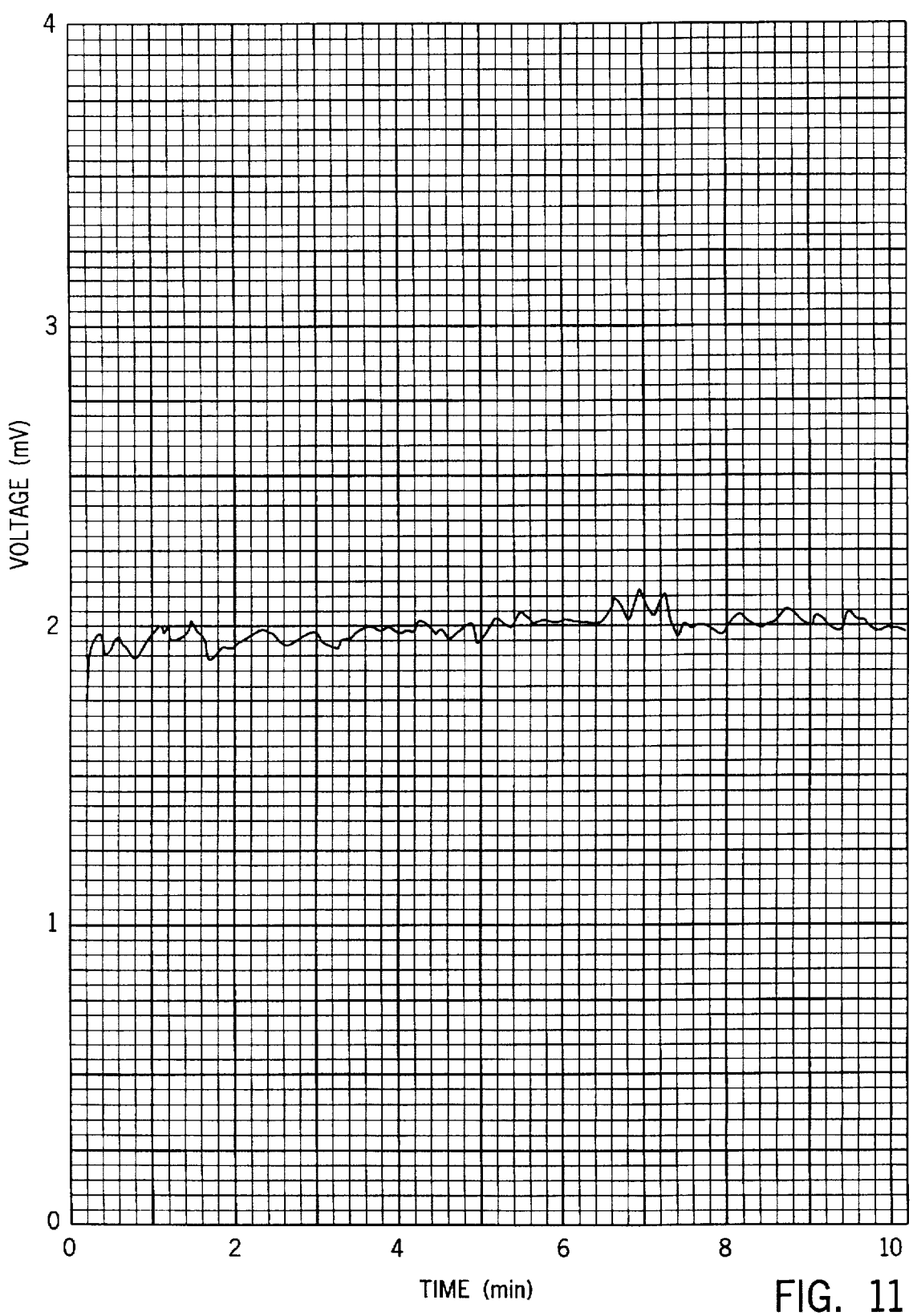
FIG. 11 shows data taken where sample voltage is monitored over time while a steady current of five amperes is passed through the high temperature superconductor.
Figure 12:
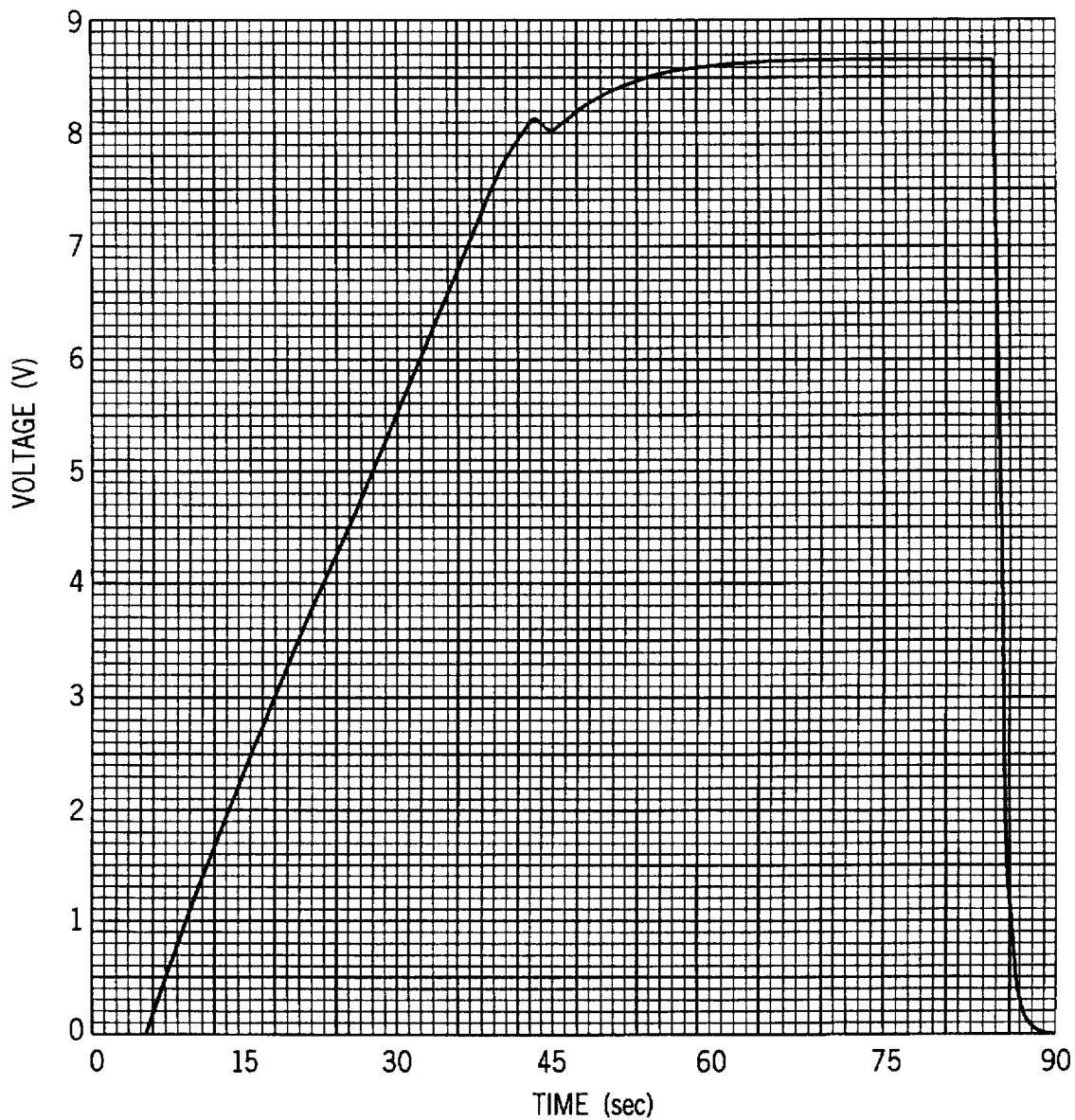
FIG. 12 shows monitoring of sample voltage similar to FIG. 11 at a higher current level of 5.75 amperes.

This advantage is demonstrated in FIGS. 10, 11, and 12. FIG. 10 shows a series of I-V curves for an epoxy-encapsulated filament. Each curve represents data taken with a different current pulse length. Note that in all cases, a sharp inflection in the sample voltage occurs between 5.5 and 6 amps. FIG. 11 shows data taken on this same filament where the filament voltage is monitored over time while a steady current of five amps is passed through the filament. The sample voltage remains steady at about 2 mV over the course of 10 minutes, indicating that no significant heating of the filament is occurring. FIG. 12 shows a similar monitoring of the filament voltage at a higher current level of 5.75 A. As the FIG. 10 data would indicate, there is a sharp increase in the filament voltage over time as the filament is heated, but, significantly, the voltage stabilizes at 8.7 V, indicating that a steady state temperature has been reached. The epoxy-encapsulated filament is, therefore, thermally stable and an ideal candidate for a fault current limiter conductor.

Figure 13:
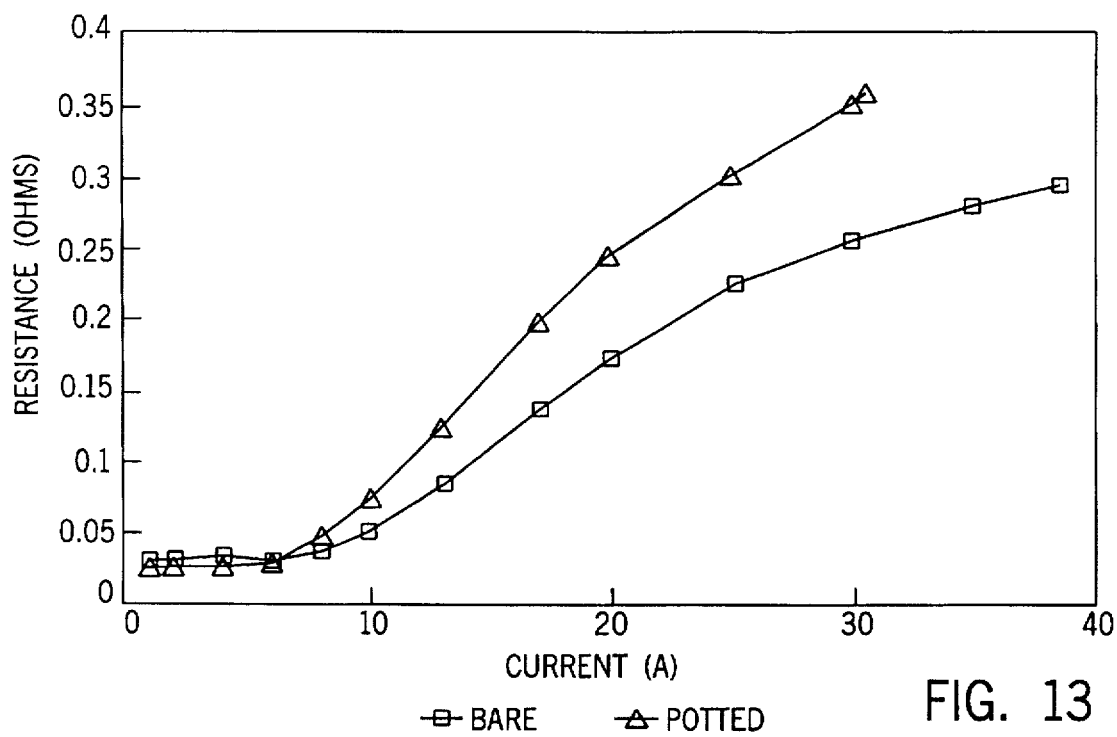
FIG. 13 shows the I-R response of the same filament to a one-millisecond-long current pulse before and after encapsulation, indicating the degree of enhancement achieved.

Epoxy encapsulation provides for an enhanced faulted state resistivity even for very short current pulses. FIG. 13 shows the I-R response of the same filament to a one-millisecond-long current pulse before and after encapsulation, indicating the degree of enhancement achieved.

Figure 14B:
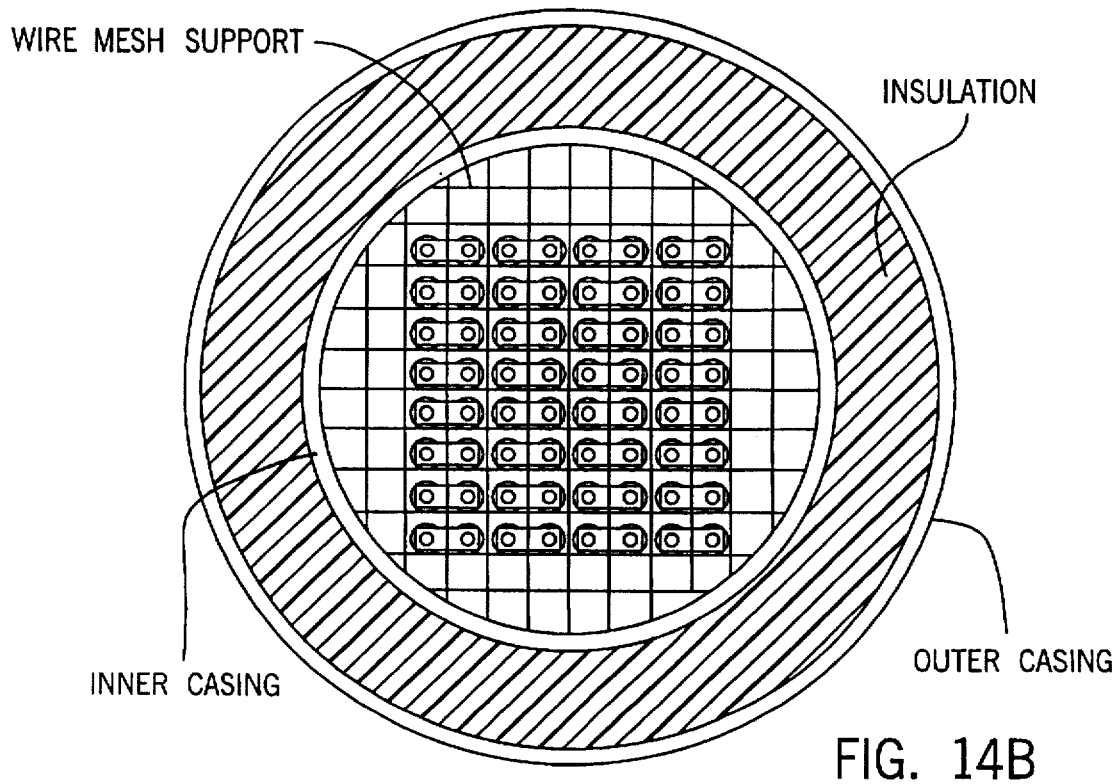

FIG. 14 shows a practical fault current limiting device that can be made using epoxy encapsulated conductors. This device is made of an array of conductors, each consisting of four filaments, connected in parallel. As designed, this current limiter has a typical operating current of 25 A and a faulted state resistance of 5 ohms at 50 A.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A high temperature superconductor fault current limiter for use in an electrical current carrying circuit capable of carrying a fault current, comprising:
   a high temperature superconductor material disposed in said electrical current carrying circuit, and
   means for insulating said superconductor material for controlling heating of the high temperature superconductor material during a fault current excursion to increase electrical resistance and said insulating means further exhibiting a thermal conductivity to prevent thermal runaway.

2. The fault current limiter defined in claim 1, wherein said high temperature superconductor material comprises a filament having a diameter of less than two millimeters.

3. The fault current limiter defined in claim 1, wherein said means for insulating is selected from the group consisting of epoxy and filled thermoplastics.

4. The high temperature superconductor fault current limiter as defined in claim 1 wherein said high temperature superconductor material comprises a plurality of filaments electrically connected in parallel in the electrical current carrying circuit.

5. The fault current limiter as defined in claim 1, wherein said high temperature superconductor material comprises 123YBCO.

6. A method of producing a high temperature superconductor fault current limiter, comprising the steps of:
   providing a high temperature superconductor material having a critical current; and
   substantially encapsulating said high temperature superconductor material in a thermally conductive epoxy having thermal expansion properties at least as great as thermal expansion properties of said high temperature superconductor material, thereby enabling said epoxy to shrink and to compress said high temperature superconductor material when cooled and further using said epoxy having a thermal conductivity and thickness such that a balanced quasi-stable thermal state is achieved during a fault condition while operating the superconductor material above the critical current.

7. The method as defined in claim 6, wherein said high temperature superconductor material comprises a filament having a diameter of less than two millimeters.

8. The method as defined in claim 6, wherein said epoxy comprises a layer of epoxy less than two millimeters thick.

9. The method as defined in claim 6, wherein said high temperature superconductor material comprises 123YBCO.

10. The method as defined in claim 6, wherein said high temperature superconductor material comprises a plurality of filaments electrically connected in parallel in the electrical current carrying circuit.

11. A method of producing a conductor for a high temperature superconductor fault current limiter, comprising the steps of:

providing a high temperature superconductor material;

placing at least a portion of said high temperature superconductor material in a container; and filling at least a portion of said container with epoxy to substantially encapsulate said high temperature superconductor material in a layer of epoxy of substantially uniform thickness said epoxy having a specific heat, thermal conductivity and a thickness such that electrical terminal resistance of the high temperature superconductor material increases in a controlled manner once its critical current density is exceeded, thereby preventing thermal runaway while operating the superconductor material above its critical current.

12. The method as defined in claim 11, wherein said high temperature superconductor material comprises a filament having a diameter of less than two millimeters.

13. The method as defined in claim 11, wherein said layer of epoxy is less than two millimeters thick.

14. The method as defined in claim 11, wherein said high temperature superconductor material comprises 123YBCO.

15. The method as defined in claim 11, wherein said high temperature superconductor material comprises a plurality of filaments electrically connected in parallel in the electrical current carrying circuit.

16. A method of controlling a fault current in an electrical current carrying circuit, comprising the steps of:

providing a high temperature superconductor material of selected structural size and having a critical temperature;

coupling said high temperature superconductor material to the electrical current carrying circuit; and substantially encapsulating said high temperature superconductor material in an epoxy layer having a coefficient of thermal expansion at least substantially equal to a coefficient of thermal expansion of said high temperature superconductor material, said epoxy layer further having thermal conductivity properties selected to allow heating of said high temperature superconductor material above its critical temperature to increase electrical resistance while avoiding thermal runaway by selecting a balance of parameters of the selected structural size of the high temperature superconductor material and the thermal conductivity of the epoxy layer.

17. The method as defined in claim 16, wherein said high temperature superconductor material comprises a filament having a diameter of less than two millimeters.

18. The method as defined in claim 16, wherein said epoxy layer is less than two millimeters thick.

19. The method as defined in claim 16, wherein said high temperature superconductor material comprises 123YBCO.

20. The method as defined in claim 16, wherein said high temperature superconductor material comprises a plurality of filaments individually encapsulated in epoxy and electrically connected in parallel in the electrical current carrying circuit.

* * * * *

UNITED STATES PATENT AND TRADEMARK OFFICE
CERTIFICATE OF CORRECTION

PATENT NO. : 5,761,017

DATED : June 2, 1998

INVENTOR(S) : James D. Hodge, et al.

It is certified that error appears in the above-identified patent and that said Letters Patent is hereby corrected as shown below:

In the table in Columns 5 and 6, the heading of the second column, delete "Mft." and insert --Mfr.--.

In the table in Columns 5 and 6, the last three lines, delete "Internationai" and insert --International--.

In the table in Columns 7 and 8, the heading of the second column, delete "Mft." and insert --Mfr.--.

In Column 9, line 26, insert a comma --,-- after "first".

In Column 9, line 26, delete the comma "," after "epoxy".

Signed and Sealed this

Sixteenth Day of March, 1999

Attest:

Q. TODD DICKINSON

Attesting Officer

Acting Commissioner of Patents and Trademarks